(12) United States Patent
Lambert (10) Patent No.: US 10,117,356 B2
(45) Date of Patent: Oct. 30, 2018

(54) HEAT SINK CONNECTOR PIN AND ASSEMBLY

(71) Applicant: Advanced Micro Devices, Inc., Sunnyvale, CA (US)

(72) Inventor: Donald L. Lambert, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/362,064

(22) Filed: Nov. 28, 2016

(65) Prior Publication Data

US 2018/0150114 A1 May 31, 2018

(51) Int. Cl.
*H05K 7/20* (2006.01)
*H05K 1/02* (2006.01)
*F16B 21/12* (2006.01)
*H01L 23/40* (2006.01)

(52) U.S. Cl.
CPC ......... *H05K 7/2049* (2013.01); *H05K 1/0203* (2013.01); *H05K 7/20154* (2013.01); *F16B 21/12* (2013.01); *H01L 23/4006* (2013.01); *H05K 2201/066* (2013.01); *H05K 2201/09063* (2013.01)

(58) Field of Classification Search
CPC ............. H05K 7/2049; H05K 7/20154; H05K 1/0203; H01L 23/40–23/4006; H01L 23/4093; H01R 12/7076; F16B 21/00
USPC .......... 361/709, 710, 719; 292/227, 127, 53, 292/252; 165/80.1–80.3; 257/718–719; 411/107, 353, 508
See application file for complete search history.

(56) References Cited

U.S. PATENT DOCUMENTS 4,760,495 A * 7/1988 Till ................... F16B 5/0233
174/138 D
5,199,733 A * 4/1993 DeLorme ................. B60D 1/02
24/453

(Continued)

FOREIGN PATENT DOCUMENTS

JP 2004-071839 A 3/2004
KR 10-2014-0127190 A 11/2014

OTHER PUBLICATIONS

Rivets; ITW Fastex; from www.itw-fastex.com/rivets; Nov. 16, 2016.

(Continued)

*Primary Examiner* — Zachary M Pape
(74) *Attorney, Agent, or Firm* — Faegre Baker Daniels LLP (57) ABSTRACT

A heat sink connector pin includes a pin assembly with linkage that provides the movement of a pin head or cap in a downward movement to cause multiple movable fingers at an opposing end of the pin to mechanically move from a retracted position that allows insertion of the heat sink connector pin through an opening in the substrate, such as a through-hole, to move to an outward extended position so that the multiple fingers engage or grasp a bottom surface of the substrate. In one example, the movable fingers are rotatably connected to share a same rotational axis with each other. In one example, the pin assembly includes a sleeve adapted to receive the shaft structure and is adapted to engage with the pin head. The sleeve includes a substrate stop surface adapted to contact a top surface of the substrate during insertion of the pin through the substrate.

16 Claims, 5 Drawing Sheets

(56) References Cited

U.S. PATENT DOCUMENTS

| | | | | |
|---|---|---|---|---|
| 5,517,734 | A | * | 5/1996 | Korpi ........................ B60D 1/02 24/453 |
| 6,061,240 | A | | 5/2000 | Butterbaugh et al. |
| 6,752,577 | B2 | * | 6/2004 | Chen .......................... G06F 1/20 165/80.3 |
| 7,164,583 | B2 | * | 1/2007 | Lee ..................... H01L 23/4093 165/80.3 |
| 7,489,511 | B2 | * | 2/2009 | Yang ................... H01L 23/4093 24/453 |
| 2003/0159819 | A1 | | 8/2003 | Lee |
| 2004/0027807 | A1 | | 2/2004 | Kashiwagi |
| 2004/0238947 | A1 | | 12/2004 | Rumer et al. |
| 2005/0072558 | A1 | | 4/2005 | Whitney et al. |
| 2011/0027038 | A1 | * | 2/2011 | Hsu ..................... H01L 23/4093 411/105 |
| 2011/0194257 | A1 | | 8/2011 | Chen |

OTHER PUBLICATIONS

Electronic Fasteners and Wire Management Products; ITW Fastex; from www.itw-fastex.com/electronics; Nov. 16, 2016.

Spring Screw Connector; Oct. 13, 2016.

Heat sink connector pins; from www.frostytech.com/articleview.cfm?articleID+2571; Nov. 22, 2016.

Intel style push pin (2 parts); Oct. 13, 2016.

Push pins with springs (non-removable 'arrowhead' type); Oct. 13, 2016.

European Patent Office; European Search Report; Application No. 16204147.9; dated Jul. 26, 2017.

European Patent Office; European Office Action; Application No. 16204147.9; dated Aug. 8, 2017.

Korean Intellectual Property Office; International Search Report and Written Opinion; International Application No. PCT/US2017/063367; dated Mar. 26, 2018.

* cited by examiner

HEAT SINK CONNECTOR PIN AND ASSEMBLY

FIELD OF THE DISCLOSURE

The disclosure relates to pins that are used to attach heat sinks to substrates that support heat dissipating devices such as microprocessors, memory or other electronic circuits.

BACKGROUND OF THE DISCLOSURE

Electronic devices such as microprocessors, graphics processors, accelerated processing units or other electronic circuits may dissipate large amounts of heat when operating. The electronic devices are sometimes placed in sockets which are then soldered to substrates such as circuit boards. Heat sinks are then placed in thermal contact with outer surfaces of the device (such as the outer surface of the package) to draw heat away from the electronic device. Fans may also be employed as well in an attempt to keep the heat dissipating device cool.

Heat sink attachment pins also referred to as connector pins are often used to attach the heat sink to the substrate when it is placed on top of or under the electronic device. Some heat sink connector pins include push pin designs that are effectively two piece designs that use a rod that is pushed through a hole down the center of the pin to push finger like push mechanisms in the through-hole of the substrate to mechanically engage with the interior of the through-hole. The separate locking rod or pin holds open the push fingers which form an engagement with the interior of the through-hole of the substrate. Push pins however can be manually intensive to insert and can be difficult to remove. Other designs may include single pieces of plastic that have a pin head and angled tip (arrow head) with barbs along with a spring placed around a shaft of the pin in an effort to provide downward force to keep the heat sink pressed against the electronic device. The angled tip is forced into the through-hole causing deformation of the tip and the barb is forced through the hole. The barb then expands after being forced through the through-hole and the pin is then fixedly engaged in the hole. Such designs can require unnecessary amounts of force to insert the pin and are also typically not removable. Problems also arise where the electronic device is fragile and forcing the angled tip through the hole of the substrate can unnecessarily cause damage to the electronic device and substrate. Also, to remove some pins, both the top and underside of the substrate have to be made accessible as such a machine or dissembler has to have access to both the top of the substrate and the bottom of the substrate.

Other through-hole attachment mechanisms include a screw and a bolt combination that is screwed into a back plate or retention frame.

Accordingly, it would be desirable to have an improved heat sink connector pin that overcomes one or more of the above problems.

BRIEF DESCRIPTION OF THE DRAWINGS

The disclosure will be more readily understood in view of the following description when accompanied by the below figures and wherein like reference numerals represent like elements, wherein.

DETAILED DESCRIPTION OF EMBODIMENTS

In one example, a heat sink connector pin includes a pin assembly with linkage that provides the movement of a pin head or cap in a downward movement to cause multiple movable fingers at an opposing end of the pin to move from a retracted position that allows insertion of the heat sink connector pin through an opening in the substrate, such as a through-hole, to mechanically move to an outward extended position so that the multiple fingers engage or grasp a bottom surface of the substrate. In one example, the pin head is rotatable in a twisting action to cause downward movement of a shaft structure to cause the fingers to move in an outward extended position to grasp the bottom surface of the substrate such as an integrated circuit socket or printed circuit board or any other suitable substrate. In other examples, any suitable force action may be employed other than a rotational or twisting motion that causes the shaft of the pin assembly to move in a downward motion to cause the fingers to move to a position to engage the bottom surface of the substrate.

One or more advantages of the design includes, for example, a reduction in installation time and/or a reduction in the vertical force on a substrate reducing potential for hardware failure. In addition or alternatively, the heat sink connector pin may allow easier visual indication as to whether or not the pin is secured to the substrate and may only require access to a top surface of the substrate when inserting and removing the heat sink connector pin into a heat sink assembly.

In one example, a heat sink connector pin for attaching a heatsink to a top surface of a substrate and in thermal contact with a heat dissipating device, includes a pin assembly having a pin head at a first end and a plurality of moveable fingers at a second end. A shaft structure is operably engaged to the moveable fingers and to the pin head. The shaft structure is configured for downward movement, via rotational movement of pin head, pressing down on the pin head or any other suitable action causing downward movement of the shaft structure. In one example, the plurality of moveable fingers are configured to be in a retracted position that allows insertion of the second end through an opening in the substrate without deforming the plurality of movable fingers. The fingers are also configured to mechanically move outward to an extended position in a manner that positions the plurality of fingers to contact a bottom surface of the substrate, in response to downward movement of the shaft structure. The moveable fingers have a substrate engagement surface adapted to engage a bottom surface of the substrate when in the outward extended position.

In one example, the plurality of movable fingers are rotatably connected to share a same rotational axis with each other. In one example, the pin assembly includes a sleeve adapted to receive the shaft structure and is adapted to engage with the pin head. The sleeve includes a substrate stop surface adapted to contact a top surface of the substrate during insertion of the second end through the substrate opening.

In one example, the sleeve includes a threaded portion and the pin head includes a corresponding threaded portion adapted to engage with the threaded portion of the sleeve. In one example, the sleeve includes a finger guide portion adapted to receive the plurality of fingers. In one example, the finger guide portion includes finger slots configured to guide the plurality of moveable fingers when moving from the retracted position to the outwardly extended position. In one example, the finger guide includes a finger engagement surface configured to contact a heel portion of a finger.

In one example, the heat sink connector pin includes a spring configured around the sleeve. In another example, a heat sink assembly includes the substrate that supports a heat generating device, the substrate defining at least one two through-holes. The heat sink assembly includes a heat sink in thermal contact with the heat generating device and a heat sink connector pin engaged with the heat sink and inserted through the through-hole of the substrate. The heat sink connector pin configured to affix the heat sink to the substrate. The heat sink connector pin being of a type set forth above. In one example the heat sink connector pin includes a pin assembly having a pin head at a first end and a plurality of moveable fingers at a second end. A shaft structure is operably engaged to the moveable fingers and to the pin head. The shaft structure is configured for downward movement, via rotational movement of pin head, pressing down on the pin head or any other suitable action causing downward movement of the shaft structure. In one example, the plurality of moveable fingers are configured to be in a retracted position that allows insertion of the second end through an opening in the substrate without deforming the plurality of movable fingers. The fingers are also configured to mechanically move in an outward extended position in response to downward movement of the shaft structure that configures the fingers to contact a bottom surface of the substrate. The moveable fingers have a substrate engagement surface adapted to engage the bottom surface of the substrate when in the outward extended position.

In one example, the plurality of movable fingers are rotatably connected to share a same rotational axis with each other. In one example, the pin assembly includes a sleeve adapted to receive the shaft structure and is adapted to engage with the pin head. The sleeve includes a substrate stop surface adapted to contact a top surface of the substrate during insertion of the second end through the substrate opening.

In another example, sleeve includes a heat sink stop surface and a substrate stop surface, the substrate stop surface adapted to contact a top surface of the substrate during insertion of the second end through the substrate opening, and wherein each of the plurality of the movable fingers includes a substrate engagement surface adapted to engage a bottom surface of the substrate when in the outward extended position.

In one example, two or more fingers serve as substrate bottom grips when they are extended in an outward position. Another surface of the pin assembly serves as a top side substrate stop surface so that a sleeve of the pin assembly does not pass through the through-hole and the movable fingers pass through in a retracted position and extend outwardly after passing through the opening in the substrate. If desired, a compression spring is used that provides downward pressure pushing the heat sink against the heat dissipating device and enhances shock absorption. In one example, the pin head is configured for a quarter turn or half turn causing the shaft to move in a downward position to cause the plurality of fingers to engage with the bottom of the substrate. In one example, the pin head has a shape so that the user can determine whether a heat sink connector pin is properly installed. Where a compression spring is employed, rotating or turning the pin head causes the compression of the spring which can further cause an upward force to be applied by the outwardly extended fingers, however any suitable structure may be employed.

Figure 1:
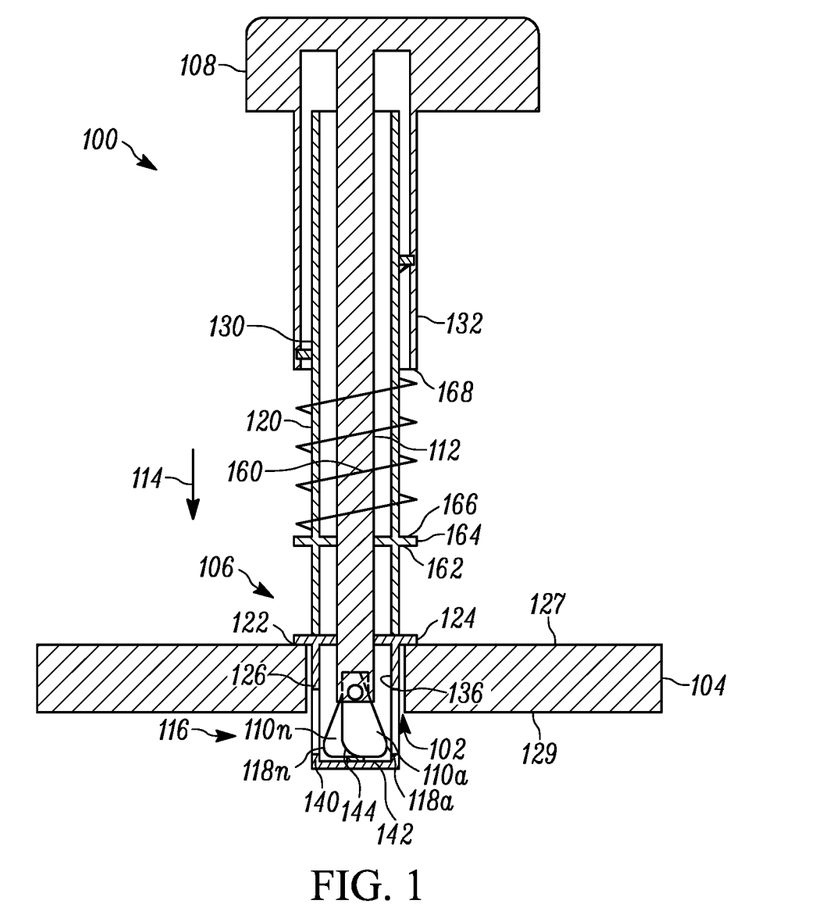
FIG. 1 is a cross sectional view of one example of a connector pin in accordance with the disclosure.

FIG. 1 is a cross sectional view illustrating one example of a heat sink connector pin 100 that is being inserted through an opening 102 of a substrate 104 such as a printed circuit board, chip carrier, or any other suitable substrate. Not shown is a heat sink (see FIG. 5) which is connected to the substrate using the heat sink connector pin 100. In this example, a heat sink coupling portion 106 that engages with an arm of a heat sink is employed however, such a portion may not be necessary depending upon the design of the heat sink. For example, there would be no need if the heat sink does not include attachment arms and instead includes through-holes through another portion of the heat sink. The heat sink connector pin 100 in this example is configured as a pin assembly that includes a pin head 108 at a first end of the pin assembly and a plurality of movable fingers 110a-110n that are located at a second end of the pin assembly. A shaft structure 112 is engaged to the movable fingers and to the pin head for downward movement shown by arrow 114 as the pin head 108 moves downward. Movement of the pin head in a vertical or downward motion toward the substrate mechanically extends the fingers in an outward position in a manner that positions the plurality of fingers to contact a bottom surface of the substrate.

Figure 2:
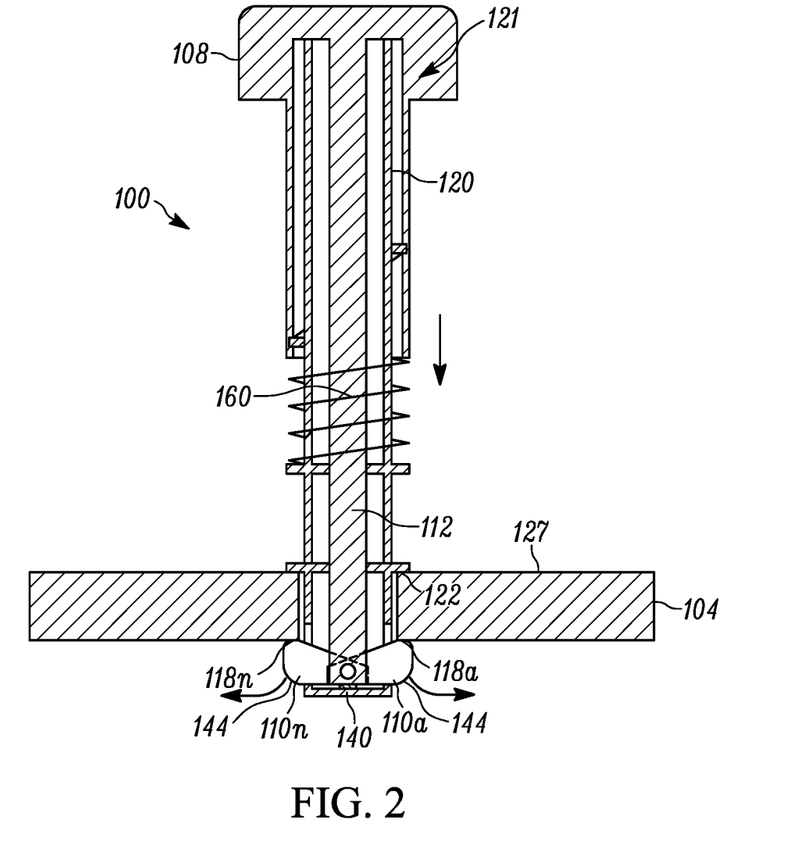
FIG. 2 is a cross sectional view of one example of a connector pin in accordance with the disclosure.

Referring also to FIG. 2 which illustrates the heat sink connector pin in an installed or engaged position, where the movable fingers 110a-110n are in an outwardly extended position so that at least a portion of the fingers extend beyond an edge of the opening and can contact a bottom surface of the substrate. In contrast, the retracted position of the fingers in FIG. 1 allows frictionless insertion of the fingers through the opening 102, in this example a through-hole in the substrate 104. The second end is configured so that the fingers 110a and 111 are not deformed when they are passed through the through-hole thereby allowing a type of zero insertion force configuration. As illustrated in FIG. 2, the plurality of movable fingers 110a and 110n are in an outward extended position in response to downward movement of the shaft structure 112 thereby engaging a bottom surface of substrate 104 that is adjacent to the through-hole. In this example, each of the movable fingers 110a and 110n include a substrate engagement surface 118a and 118n that are adapted to engage the bottom surface of the substrate 104 when they are in the outward extended position.

Figure 3:
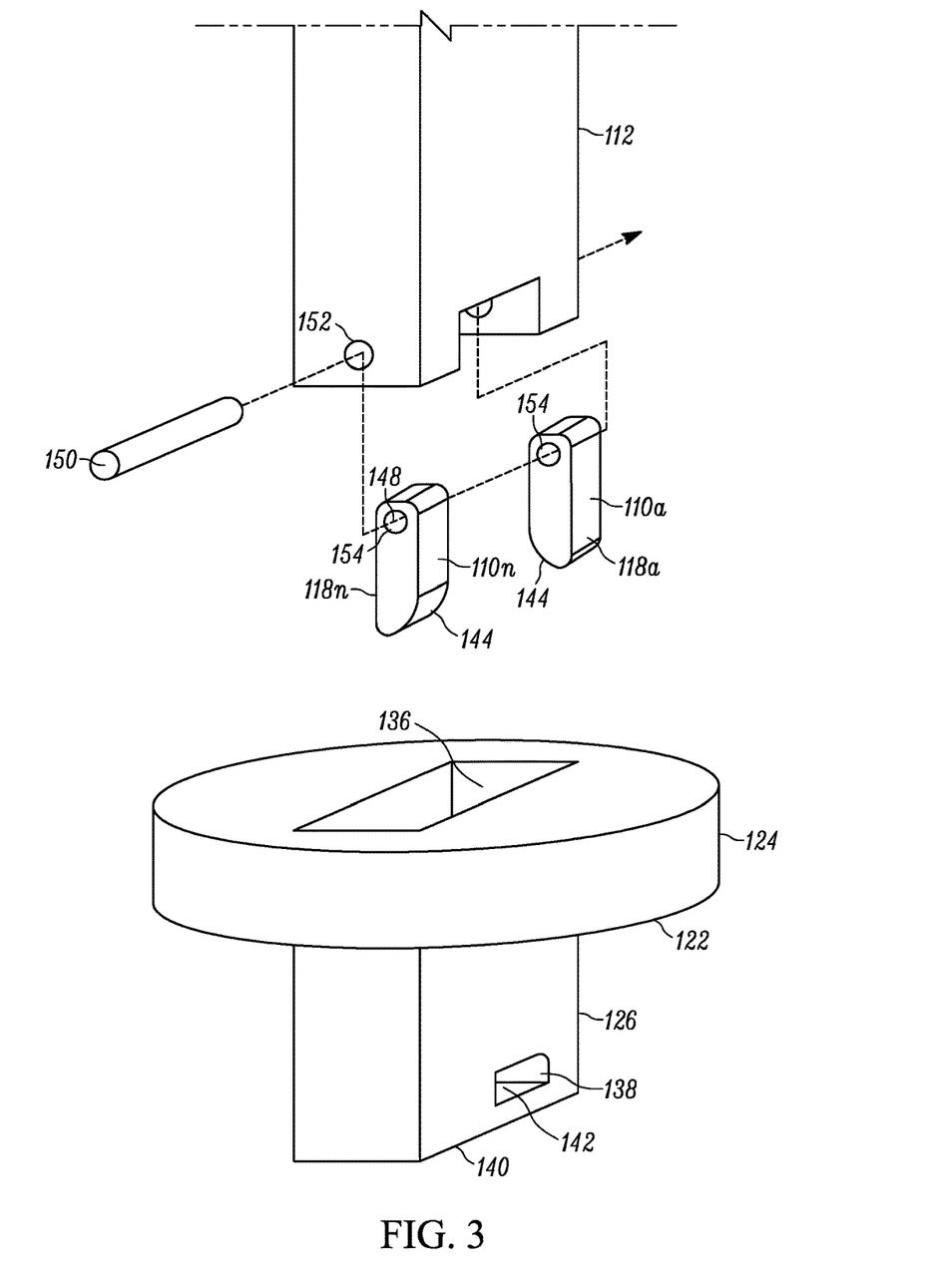
FIG. 3 is an assembly view of another embodiment of a portion of the connector pin shown in FIG. 1.
Figure 4:
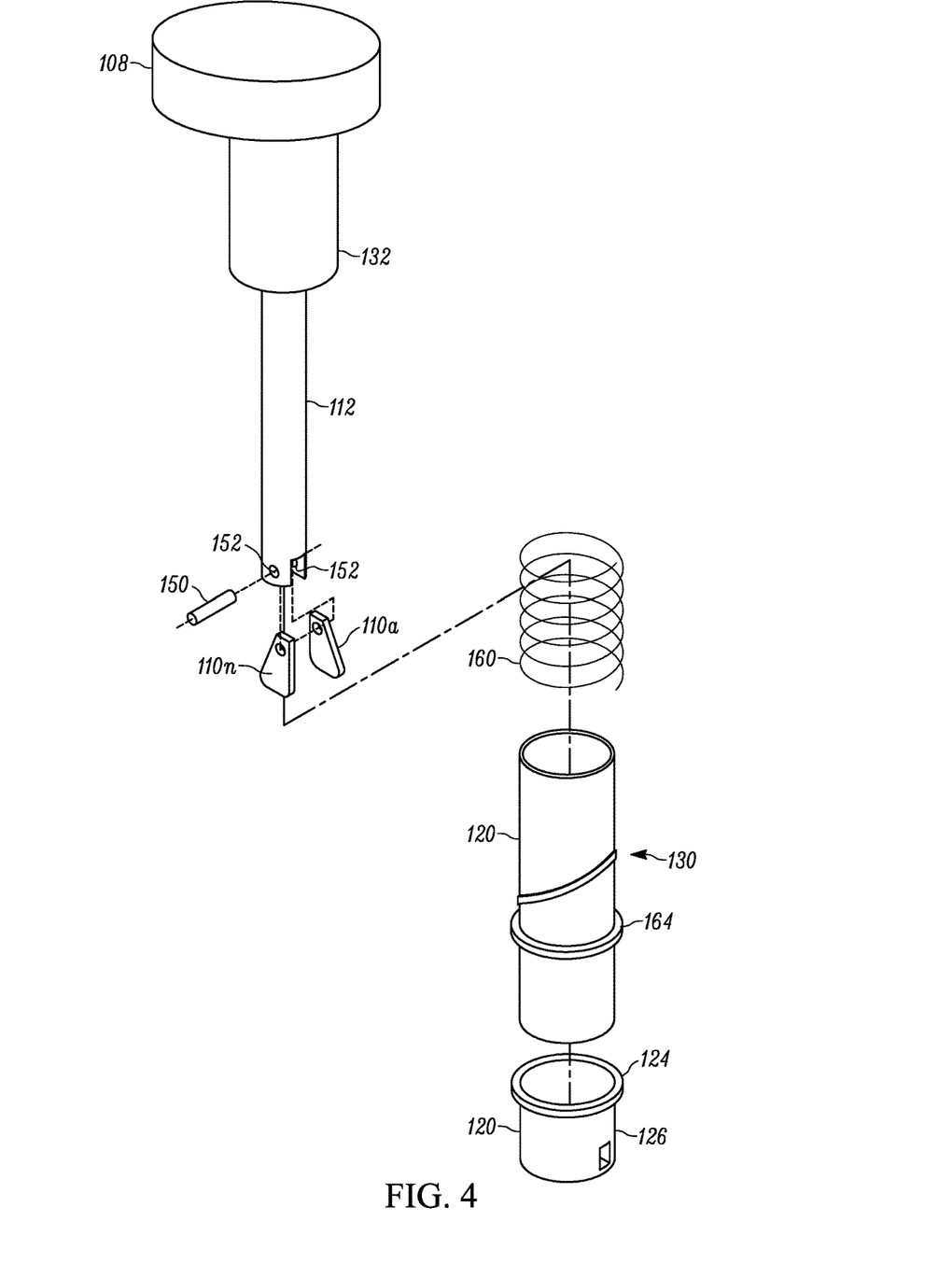
FIG. 4 is an assembly view of the connector pin shown in FIG. 1.

Referring also to FIG. 3 and FIG. 4, the pin assembly includes a sleeve 120 that is adapted to receive the shaft structure 112. FIG. 3 illustrates a non-cylindrical shaft design that may be employed instead of a cylindrical design (shown in FIG. 4). FIG. 4 illustrates a cylindrical shaft and corresponding sleeve as illustrated in FIGS. 1 and 2. The sleeve 120 is also adapted to engage with the pin head 108 by reciprocally sliding in an opening 121 (see FIG. 2) in the pin head 108 adapted to receive the sleeve 120. The sleeve 120 includes a substrate stop surface 122 shown in this example as a bottom surface of a substrate stop member 124. However, any suitable surface of the sleeve or other structure may be employed. In this example the stop members 124 and 164 are shown as a disk structure that guides the shaft structure 112 however, there may be no need for a guide feature if the shaft structure does not need one nor do the stop members need to extend outwardly from the sleeve if desired. The substrate stop surface 122 is adapted to contact a top surface 127 of the substrate 104 during insertion of the second end 116 through the substrate opening 102.

The pin head 108, sleeve 120, shaft 112, fingers 118a and 118n may be formed from plastic or any other suitable material. In this example, the sleeve 120 is made of multiple pieces that may be interconnected in any suitable manner such as snap fit, glue or in any suitable manner or may be a single piece if desired. In this example, the sleeve 120 includes a finger guide portion 126 which guides the fingers through the opening of the substrate. In this example, the finger guide portion 126 includes the substrate stop member 124 however the stop member 124 or any other portion of the sleeve providing the substrate stop surface 122 may be incorporated in any other suitable part of the sleeve 120 as desired. In the example shown in FIGS. 1, 2 and 4 the finger guide portion 126 is cylindrical by may also be any suitable cross section or shape including conical to form a tapered tip for frictionless entry into the substrate opening.

The shaft 112 may also be a single piece or made from multiple pieces as desired. In this example, the shaft 112 is attached to an interior of the pin head 108 for vertical (axial) movement but not rotational movement via a "C" clamp or other suitable structure inside the pin head 108 that receives the end of the shaft. However, attachment of the shaft may be done in any suitable manner.

The sleeve 120 includes a threaded portion 130 and the pin head 108 includes a corresponding threaded portion 132 that is adapted to engage with the threaded portion 130 of the sleeve 120 to allow upward and downward movement of the pin head 108 with respect to the sleeve 120 in this example. However, any suitable structure may be employed other than a rotational mechanism to allow the pin head 108 to move in a downward motion causing the shaft 112 to move the movable fingers 110a and 110n in an outward position to engage a bottom surface of the substrate. The finger guide portion 126 receives the plurality of fingers 110a-110n, in this example through a channel 136 defined by the sleeve. The channel 136 also receives the shaft 112. In this example, the finger guide portion 126 includes finger slots 138 (FIG. 3) that are configured to guide the plurality of movable fingers 110a-110n from moving from the retracted position to the outwardly extended position. However, such finger slots may not be necessary depending on the design.

In this example, the finger guide portion 126 includes a bottom 140 having a finger engagement surface 142 that is configured to contact a heel portion of a finger 144 and the curved portion of the heel makes contact with the bottom to force the fingers in an outward position. However, any other suitable mechanism may be employed to cause the fingers to expand outwardly to engage a bottom surface of the substrate. The plurality of movable fingers 110a-110n are rotatably connected to share a common axis shown as dashed line 148 which is a same rotational axis. In this example, this is accomplished using a pin 150 placed through corresponding openings in the shaft 112 shown as opening 152 and corresponding openings 154 in the fingers. However, it will be recognized that any suitable connecting structure may be employed. The pin 150 may also be made from plastic, metal or any other suitable material. Other examples for connecting the fingers to rotate about an axis includes posts, or any other suitable engagement surfaces that connects the shaft 112 with the fingers so that the fingers rotatably move between a retracted position and extended position and share a same rotational axis. In another example, the rotational axis need not be shared if desired.

As shown in FIGS. 1 and 2, a spring 160 serves as a compression spring that is configured around an outer surface of the sleeve 120. This spring 160 may not be necessary but can provide additional benefits such as allowing absorption during vibrations to cause the extended fingers 110a-110n (FIG. 2) to be continuously forced against the bottom surface of the substrate 104. As shown in FIG. 1, the spring 160 is not compressed, and as shown in FIG. 2, the spring 160 is compressed through downward motion of the shaft 112 using the pin head 108 to push downwardly on the shaft 112. In this example, a rotational movement of the pin head 108 causes the threaded portion of the cap to move down the sleeve. The fingers are caused to pass through the finger guide portion 126. The fingers 110a-110n are then extended outward to grasp the bottom surface 129 of the substrate 104. In this example, the heels of the fingers contact the surface 142 pushing the fingers outward. However, the surface 142 may not be needed depending on the design as long as the fingers 110a-110n are caused to extend outwardly. Also in this example, the shape of the pin head 108 at the top of the pin head is shaped in a manner that allows a user to visually identify that the pin head 102 has been rotated thereby indicating proper installation. To remove the pin from a heat sink assembly, the pin head is rotated in the opposite direction. As noted above, the shaft 112 is secured for vertical (axial) movement with pin head but not rotational movement via a "C" clamp or other suitable structure inside the pin head area that receives the end of the shaft. When the rotational movement is reversed, the shaft has no force on it, and the fingers release the bottom of the substrate. With the outside spring compression, the fingers are forced back into the cylinder.

The cross section of the shaft 112 may be any suitable shape including cylindrical, square, conical or any suitable shape as desired. Likewise, the fingers 110a and 110n may be any suitable shape as desired. The heat sink connector pin 100 in this example also includes a heat sink stop surface 162 to contact a surface of the heat sink such as a top portion of a heat sink arm (such arms as known in the art) such as arm 400 shown in FIG. 5. The support surface 164 may also have a top surface 166 that supports the spring 160. Also in this example, the cap 108 includes a bottom surface 168 that serves as an opposing supporting surface for the spring to allow compression of the spring during downward movement of the cap 108. However, it will be recognized that such support surfaces may not be needed where a spring is not employed or depending on the design of the heatsink.

Figure 5:
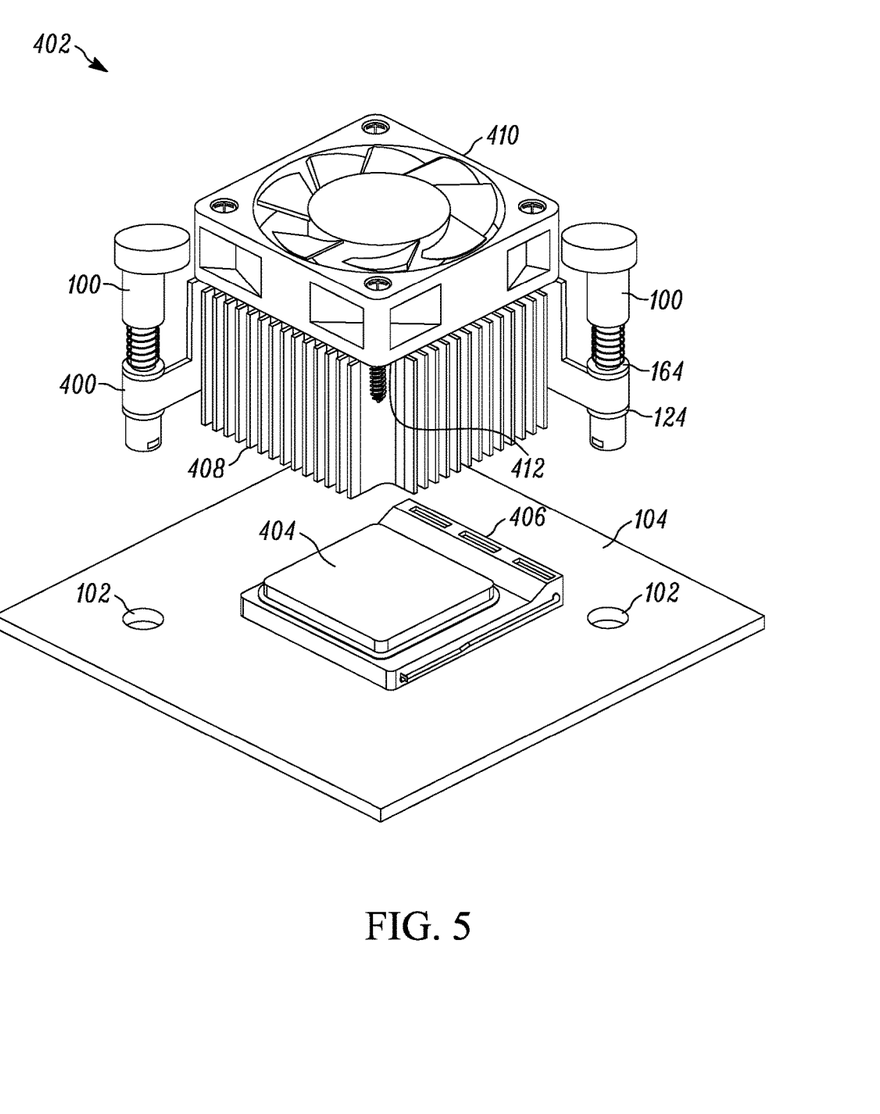
FIG. 5 is an assembly view illustrating one example of a heat sink assembly in accordance with the disclosure.

Referring also to FIG. 5, a heat sink assembly 402 is shown illustrating the substrate 102 that supports a heat generating device 404 which in this example is shown to be a microprocessor, APU, GPU, or any other suitable integrated circuit. In this example, the integrated circuit is in a package that is also shown to be in a carrier 406 although any suitable heat dissipating device may benefit. A heat sink 408 is in thermal contact with the heat generating device 404 when placed in contact with the heat dissipating device through any suitable heat conducting members if a direct connection is not employed. The heat sink connector pins 100 are inserted through the through-holes 102 of the substrate and are configured to affix the heat sink 408 to the substrate 104. In this example, a fan assembly 410 is also shown to be affixed to the heat sink through attachment screws 412. The heat sink connector pins are of the type described above with reference to FIGS. 1 and 2.

As described above one or more embodiments simplifies the installation experience and can improve installation time using a system that has bottom fingers that automatically grab onto the bottom of the substrate with little vertical compressive force. Where the pin head is rotatable, a user may simply insert the heat sink connector pin into the heat sink and substrate and rotate the pin head to engage the fingers to the bottom surface of the substrate and rotate the pin head on an opposite direction to remove retract the moveable fingers. Non rotational mechanisms may also be used.

The above detailed description and the examples described therein have been presented for the purposes of illustration and description only and not for limitation. For example, the operations described may be done in any suitable manner. It is therefore contemplated that the present embodiments cover any and all modifications, variations or equivalents that fall within the scope of the basic underlying principles disclosed above and claimed herein. Furthermore, while the above description describes hardware in the form of a processor executing code, hardware in the form of a state machine or dedicated logic capable of producing the same effect, other structures are also contemplated.

What is claimed is:

1. A heat sink connector pin for attaching a heatsink to a top surface of a substrate and in thermal contact with a heat dissipating device, the pin comprising:
   a pin assembly comprising a pin head at a first end and a plurality of moveable fingers at a second end, a shaft structure operably engaged to the moveable fingers and to the pin head, the shaft structure configured for downward movement as the pin head moves downward, the plurality of moveable fingers configured to rotate about an axis and be in a retracted position that allows insertion of the second end through an opening in the substrate without deforming the moveable fingers and configured to mechanically extend in an outward position in a manner that positions the plurality of fingers to contact a bottom surface of the substrate, in response to downward movement of the shaft structure.

2. The heat sink connector pin of claim 1 wherein each of the plurality of the movable fingers comprises a substrate engagement surface adapted to engage a bottom surface of the substrate when in the outward extended position.

3. The heat sink connector pin of claim 1 wherein the pin assembly comprises a sleeve adapted to receive the shaft structure and adapted to engage with the pin head and wherein the sleeve comprises a substrate stop surface adapted to contact a top surface of the substrate during insertion of the second end through the substrate opening.

4. The heat sink connector pin of claim 3 wherein the pin assembly comprises a spring configured around the sleeve.

5. A heat sink assembly comprising:
   a substrate supporting a heat generating device, the substrate defining at least one through-hole;
   a heat sink, in thermal contact with the heat generating device;
   a heat sink connector pin inserted through the through-hole of the substrate and configured to affix the heat sink to the substrate, the heat sink connector pin comprising:
      a pin head at a first end and a plurality of moveable fingers at a second end, a shaft structure operably engaged to the moveable fingers and to the pin head, the shaft structure configured for downward movement as the pin head moves downward, the plurality of moveable fingers configured to rotate about an axis and be in a retracted position that allows insertion of the second end through the at least one through-hole in the substrate without deforming the moveable fingers and configured to mechanically extend in an outward position in a manner that positions the plurality of fingers to contact a bottom surface of the substrate, in response to downward movement of the shaft structure.

6. The heat sink assembly of claim 5 wherein each of the plurality of the movable fingers comprises a substrate engagement surface adapted to engage a bottom surface of the substrate when in the outward extended position.

7. The heat sink assembly of claim 5 wherein the pin assembly comprises a sleeve adapted to receive the shaft structure and adapted to engage with the pin head and wherein the sleeve comprises a substrate stop surface adapted to contact a top surface of the substrate during insertion of the second end through the substrate opening.

8. A heat sink connector pin for attaching a heatsink to a top surface of a substrate and in thermal contact with a heat dissipating device comprising:
   a pin assembly comprising:
      a pin head at a first end;
      a plurality of moveable fingers at a second end of the pin assembly;
      a shaft structure operably engaged to the moveable fingers and to the pin head, the shaft structure configured for downward movement as the pin head moves downward, the plurality of moveable fingers configured to be in a retracted position that allows insertion of the second end through an opening in the substrate and configured to mechanically extend in an outward position in a manner that positions the plurality of fingers to contact a bottom surface of the substrate, in response to downward movement of the shaft structure;
      a sleeve adapted to receive the shaft structure and adapted to engage with the pin head and wherein the sleeve comprises a heat sink stop surface and a substrate stop surface, the substrate stop surface adapted to contact a top surface of the substrate during insertion of the second end through the substrate opening, and
      wherein each of the plurality of the movable fingers comprises a substrate engagement surface adapted to engage a bottom surface of the substrate when in the outward extended position.

9. The heat sink connector pin of claim 8 wherein the plurality of movable fingers are rotatably connected to share a same rotational axis with each other.

10. The heat sink connector pin of claim 9 wherein the sleeve comprises a threaded portion and the pin head comprises a corresponding threaded portion adapted to engage with the threaded portion of the sleeve and wherein the sleeve comprises a finger guide portion adapted to receive the plurality of fingers and comprising channels configured to guide the plurality of moveable fingers when moving from the retracted position to the outwardly extended position.

11. The heat sink connector pin of claim 10 wherein the pin assembly comprises a spring configured around the sleeve.

12. The heat sink assembly of claim 11 wherein the finger guide portion comprises a finger engagement surface configured to contact a heel portion of a finger.

13. A heat sink connector pin for attaching a heatsink to a top surface of a substrate and in thermal contact with a heat dissipating device, the pin comprising:
   a pin assembly comprising a pin head at a first end and a plurality of moveable fingers at a second end, a shaft structure operably engaged to the moveable fingers and to the pin head, the shaft structure configured for downward movement as the pin head moves downward, the plurality of moveable fingers configured to be in a retracted position that allows insertion of the second end through an opening in the substrate without deforming the moveable fingers and configured to mechanically extend in an outward position in a manner that positions the plurality of fingers to contact a bottom surface of the substrate, in response to downward movement of the shaft structure; and wherein the plurality of movable fingers are rotatably connected to share a same rotational axis with each other.

14. A heat sink connector pin for attaching a heatsink to a top surface of a substrate and in thermal contact with a heat dissipating device, the pin comprising:

a pin assembly comprising a pin head at a first end and a plurality of moveable fingers at a second end, a shaft structure operably engaged to the moveable fingers and to the pin head, the shaft structure configured for downward movement as the pin head moves downward, the plurality of moveable fingers configured to be in a retracted position that allows insertion of the second end through an opening in the substrate without deforming the moveable fingers and configured to mechanically extend in an outward position in a manner that positions the plurality of fingers to contact a bottom surface of the substrate, in response to downward movement of the shaft structure;

wherein the pin assembly comprises a sleeve adapted to receive the shaft structure and adapted to engage with the pin head and wherein the sleeve comprises a substrate stop surface adapted to contact a top surface of the substrate during insertion of the second end through the substrate opening; and wherein the sleeve comprises a threaded portion and the pin head comprises a corresponding threaded portion adapted to engage with the threaded portion of the sleeve and wherein the sleeve comprises a finger guide portion adapted to receive the plurality of fingers and comprising finger slots configured to guide the plurality of moveable fingers when moving from the retracted position to the outwardly extended position.

15. The heat sink assembly of claim 14 wherein the finger guide comprises a finger engagement surface configured to contact a heel portion of a finger.

16. A heat sink assembly comprising:

a substrate supporting a heat generating device, the substrate defining at least one through-hole;

a heat sink, in thermal contact with the heat generating device;

a heat sink connector pin inserted through the through-hole of the substrate and configured to affix the heat sink to the substrate, the heat sink connector pin comprising:

a pin head at a first end and a plurality of moveable fingers at a second end, a shaft structure operably engaged to the moveable fingers and to the pin head, the shaft structure configured for downward movement as the pin head moves downward, the plurality of moveable fingers configured to be in a retracted position that allows insertion of the second end through the at least one through-hole in the substrate without deforming the moveable fingers and configured to mechanically extend in an outward position in a manner that positions the plurality of fingers to contact a bottom surface of the substrate, in response to downward movement of the shaft structure; and wherein the plurality of movable fingers are rotatably connected to share a same rotational axis with each other.

* * * * *